(12) United States Patent
Lee et al.

(10) Patent No.: US 7,456,697 B2
(45) Date of Patent: Nov. 25, 2008

(54) VARIABLE DEGENERATION IMPEDANCE SUPPLY CIRCUIT USING SWITCH AND ELECTRONIC CIRCUITS USING THE SAME

(75) Inventors: Jae-sup Lee, Yongin-si (KR); Kwy-ro Lee, Daejeon (KR); Sung-sik Song, Daejeon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 106 days.

(21) Appl. No.: 11/362,804

(22) Filed: Feb. 28, 2006

(65) Prior Publication Data

US 2006/0208818 A1    Sep. 21, 2006

(30) Foreign Application Priority Data

Feb. 28, 2005    (KR) .................. 10-2005-0016812

(51) Int. Cl.
*H03B 5/08* (2006.01)
(52) U.S. Cl. .................. 331/117 R; 331/177 V
(58) Field of Classification Search ............. 331/117 R, 331/177 V
See application file for complete search history.

(56) References Cited

U.S. PATENT DOCUMENTS

| | | | |
|---|---|---|---|
| 2003/0027531 | A1 | 2/2003 | Malhi et al. |
| 2004/0080374 | A1* | 4/2004 | Muramatsu ............. 331/117 R |
| 2006/0091968 | A1* | 5/2006 | Darabi et al. ........... 331/117 R |

* cited by examiner

*Primary Examiner*—Joseph Chang
(74) *Attorney, Agent, or Firm*—Sughrue Mion, PLLC

(57) ABSTRACT

A variable degeneration impedance supply circuit, including: two alternatively connected transistors; a capacitor circuit having a predetermined capacitance and serially connecting output terminals of the two transistors; and a switch for controlling on/off state between the capacitor circuit and the output terminal, according to a predetermined first control signal. The circuit further includes: at least one sub capacitor circuit arrayed in parallel to the capacitor circuit for serially connecting the output terminals of the two transistors; and at least one sub switch for controlling on/off state between the sub capacitor circuit and the output terminal, according to a predetermined control signal. Therefore, the magnitude of a degeneration impedance can be varied by controlling degeneration capacitance. Moreover, the variable degeneration impedance supply circuit can be advantageously applied to a voltage controlled oscillation circuit and a frequency divider circuit.

25 Claims, 4 Drawing Sheets

Mod = 1

Mod = 0

VARIABLE DEGENERATION IMPEDANCE SUPPLY CIRCUIT USING SWITCH AND ELECTRONIC CIRCUITS USING THE SAME

CROSS-REFERENCE TO RELATED APPLICATIONS

This application claims priority from Korean Patent Application No. 10-2005-0016812, filed on Feb. 28, 2005, the entire content of which is incorporated herein by reference.

BACKGROUND OF THE INVENTION

1. Field of the Invention

The present invention relates in general to a variable degeneration impedance supply circuit, and an electronic circuit using the same. More specifically, the present invention relates to a variable degeneration impedance supply circuit capable of varying a degeneration impedance using a switch and a capacitor, and an electronic circuit using the same.

2. Description of the Related Art

Advances in electronic technology have led to the development of a variety of types of electronic equipment. Every electronic device has an electronic circuit where passive and active electric elements are combined. Typical examples of electronic circuit are a voltage controlled oscillator (VCO), a frequency divider, etc.

A VCO is a device which makes possible to output a desired oscillating frequency with an externally applied voltage, and frequency divider is a device which divides the frequency of an input signal by a predetermined division rate. The VCO and the frequency divider are useful in many applications such as mobile communication terminals, analog sound synthesizers, etc.

A problem of these electronic circuits is that noise may be inserted into an input signal. To remove the noise, a degeneration impedance circuit combining resistors and capacitors is provided to damp a magnitude of a total output signal.

A cross coupled transistor pair is usually used to supply a degeneration impedance. However, if the magnitude of a degeneration impedance is fixed, it cannot be used for a multi-band frequency signal. For this reason, a related art degeneration impedance supply circuit utilizes a varactor for frequency tuning of an output signal. For instance, in case of a VCO, an oscillating frequency is determined by resonant frequency of parallel combinations of inductors and capacitors. In this case, a varactor is utilized to change the oscillating frequency. This is possible because the varactor has different capacitance values according to an input voltage. Unfortunately, since frequency tuning through a varactor is possible only in a band around a predetermined intermediate frequency, it is difficult to apply the varactor to an electronic circuit operating in a multi-band coverage.

SUMMARY OF THE INVENTION

The present invention provides a variable degeneration impedance supply circuit capable of adjusting the magnitude of a degeneration impedance at high precision by controlling a switch connected to a capacitor.

The present invention also provides a voltage controlled oscillation circuit operating in a multi-band, and a frequency divider circuit provided with a variable degeneration impedance supply circuit.

According to an aspect of the present invention, there is provided a variable degeneration impedance supply circuit, including: two alternately connected transistors; a capacitor circuit having a predetermined capacitance and serially connecting output terminals of the two transistors; and a switch for controlling on/off state between the capacitor circuit and the output terminal, according to a predetermined first control signal.

The two transistors may be metal oxide semiconductor (MOS) transistors, and the output terminal is a source terminal.

The capacitor circuit includes at least one serially connected capacitor.

The variable degeneration impedance supply circuit further includes: at least one sub capacitor circuit arrayed in parallel to the capacitor circuit for serially connecting the source terminals of the two transistors; and at least one sub switch for controlling on/off state between the sub capacitor circuit and the source terminal, according to a predetermined control signal.

Furthermore, the variable degeneration impedance supply circuit further includes a transistor switch for controlling on/off state between the source terminals of the two transistors, according to a predetermined second control signal.

In an exemplary embodiment, the control signal applied to the switch and/or the sub switch is an inverted signal for the second control signal.

Also, the switch and the sub switch are MOS transistors or bipolar transistors.

According to another aspect of the present invention, there is provided a voltage controlled oscillation circuit, including: an inductance-capacitance (LC) tank circuit outputting a predetermined frequency signal; a transistor circuit formed of two alternately connected transistors for supplying a degeneration impedance to remove a parasitic impedance in the LC tank circuit; and a degeneration impedance control circuit for controlling the magnitude of a degeneration impedance of the two MOS transistors, according to a predetermined control signal.

Each of the two MOS transistors in the transistor circuit receives a differential input signal to a drain terminal thereof.

The degeneration impedance control circuit includes: a capacitor circuit having a predetermined capacitance value, and connecting source terminals of the two MOS transistors in series; and a switch for controlling on/off state between the capacitor circuit and the source terminal, according to a predetermined control signal.

In an exemplary embodiment, the capacitor circuit includes at least one serially connected capacitor.

The degeneration impedance control circuit further includes: at least one sub capacitor circuit arrayed in parallel to the capacitor circuit for serially connecting the source terminals of the two transistors; and at least one sub switch for controlling on/off state between the sub capacitor circuit and the source terminal, according to a predetermined control signal.

Furthermore, the degeneration impedance control circuit further includes a transistor switch for controlling on/off state between the source terminals of the two transistors, according to a predetermined first control signal.

In an exemplary embodiment, the control signal applied to the switch and/or the sub switch is an inverted signal for the first control signal.

Moreover, the switch and the sub switch are MOS transistors or bipolar transistors.

According to another aspect of the present invention, there is provided a frequency divider circuit, including: a differential input signal detection circuit detecting a predetermined differential input signal, according to an external control signal; a transistor circuit formed of two alternately connected transistors for generating a degeneration impedance and thereby removing noise included in the input signal, and storing the noise free signal; and a degeneration impedance control circuit for controlling the magnitude of a degeneration impedance generated in the transistor circuit.

Each of the two MOS transistors in the transistor circuit receives a differential input signal to a drain terminal thereof.

The degeneration impedance control circuit includes: a capacitor circuit serially connecting source terminals of the two MOS transistors; and a switch for controlling on/off state between the capacitor circuit and the source terminal, according to a predetermined control signal.

The capacitor circuit includes at least one serially connected capacitor.

Meanwhile, the degeneration impedance control circuit further includes: at least one sub capacitor circuit arrayed in parallel to the capacitor circuit for serially connecting the source terminals of the two transistors; and a sub switch for controlling on/off state between the sub capacitor circuit and the source terminal, according to a predetermined control signal.

The degeneration impedance control circuit further includes: a transistor switch for controlling on/off state between the source terminals of the two transistors, according to a predetermined first control signal.

In an exemplary embodiment, the control signal applied to the switch and/or the sub switch is an inverted signal for the first control signal, and the switch and the sub switch are MOS transistors or bipolar transistors.

BRIEF DESCRIPTION OF THE DRAWINGS

The above and/or other aspects of the present invention will be more apparent by describing certain exemplary embodiments of the present invention with reference to the accompanying drawings, in which.

DETAILED DESCRIPTION OF THE EXEMPLARY EMBODIMENTS OF THE PRESENT INVENTION

Exemplary embodiments of the present invention will be described herein below with reference to the accompanying drawings.

Figure 1:
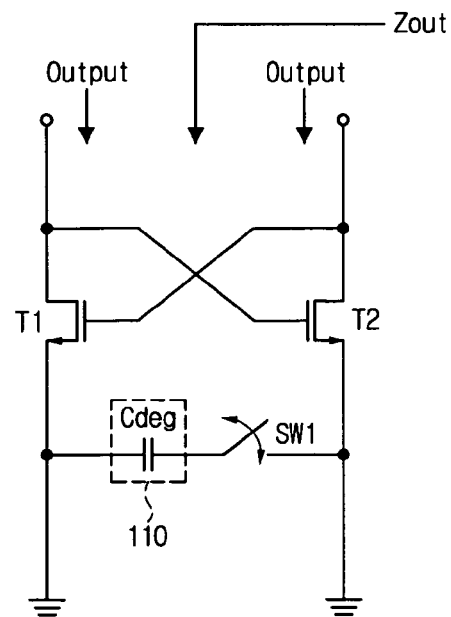
FIG. 1 is a circuit diagram illustrating the configuration of a variable degeneration impedance supply circuit, in accordance with an exemplary embodiment of the present invention.

FIG. 1 is a circuit diagram illustrating the configuration of a variable degeneration impedance supply circuit, in accordance with exemplary embodiment of the present invention. The variable degeneration impedance supply circuit supplies a degeneration impedance to another circuit that performs a predetermined function. As can be seen in FIG. 1, the variable degeneration impedance supply circuit includes first and second transistors T1, T2 connected to an output terminal of a predetermined circuit (not shown). In this case, transistors T1 and T2 are alternately connected. Although FIG. 1 illustrates a case where transistors T1 and T2 are MOS transistors, bipolar transistors can also be used.

That is, according to FIG. 1, an output signal Output performing a predetermined function is input to a drain terminal of each of the MOS transistors T1, T2. A gate terminal of the first MOS transistor T1 is coupled to the drain terminal of the second MOS transistor T2, and a gate terminal of the second MOS transistor T2 is coupled to the drain terminal of the first MOS transistor T1.

A capacitor circuit 110 and a switch SW1 are connected in series between source terminals the first and the second MOS transistor T1, T2. Although FIG. 1 illustrates a case where the capacitor circuit 110 includes one single capacitor $C_{deg}$, a plurality of serially connected capacitors may be used as well. For example, suppose that the capacitor circuit 110 embodies two capacitors, the switch SW1 can be connected between the two capacitors.

As for the switch SW1, a MOS transistor or a bipolar transistor may be used. In the case of using the MOS transistor, switching is done by inputting a predetermined control signal to the gate terminal. When the switch SW1 is on, a degeneration impedance is formed by the combination of transconductances of the first and second MOS transistors T1, T2 and the capacitance of the capacitor circuit 110.

If transconductances of the first and second MOS transistors T1, T2 are both $g_m$, the capacitance of each of the first and second MOS transistors T1 and T2 is $C_{gs}$, and the capacitance of the capacitor circuit 110 is $C_{deg}$. Then, an impedance $Z_O$ observed from the output terminal can be expressed as follows in Equation 1:

$$Z_o = -\frac{2 + (sC_{gs} + g_m)Z_{deg}}{g_m - sC_{gs}} \quad \text{[Equation 1]}$$

where $Z_{deg}$ indicates a degeneration impedance generated by $C_{deg}$ and $R_{deg}$. That is, a degeneration impedance can be expressed as follows in Equation 2:

$$Z_{deg} = R_{deg} + \frac{1}{sC_{deg}} \quad \text{[Equation 2]}$$

Where $R_{deg}$ indicates an internal resistance of the switch SW1, when the first and the second MOS transistor satisfies the relation of $g_m/C_{gs} \gg \omega$, Equation 1 can be approximated as follows in Equation 3:

$$Z_o\left(-\frac{2}{g_m} - \left(1 + \frac{sC_{gs}}{g_m}\right) * Z_{deg}\right) \quad \text{[Equation 3]}$$

Substituting Equation 2 into Equation 3 yields the following Equation 4 for an impedance observed from the output terminal.

$$Z_o = -\frac{2}{\frac{g_m}{1 + \frac{C_{gs}}{2 * C_{deg}} + \frac{g_m R_{deg}}{2}}} - \frac{1}{sC_{deg}} - \frac{sR_{deg}}{\omega_T} \quad \text{[Equation 4]}$$

Comparing Equation 2 and Equation 4, a transconductance observed from the output terminal as the switch SW1 is turned on can be expressed as follows in Equation 5:

$$g_{mt} = \frac{g_m}{1 + \frac{C_{gs}}{2 * C_{deg}} + \frac{g_m R_{deg}}{2}} \quad \text{[Equation 5]}$$

A degeneration capacitance observed from the output terminal equals to the capacitance of the capacitor circuit 110. As a result, the magnitude of a degeneration capacitance is adjustable by the switch SW1.

Figure 2:
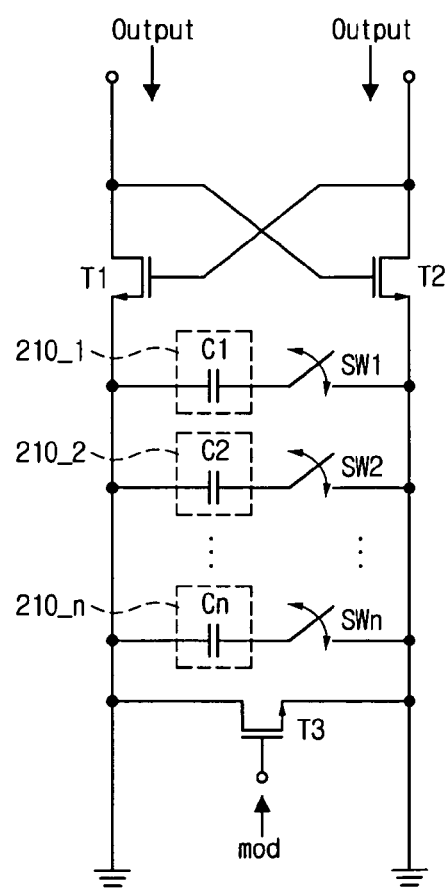
FIG. 2 is a circuit diagram illustrating the configuration of a variable degeneration impedance supply circuit, in accordance with another exemplary embodiment of the present invention.

FIG. 2 illustrates the configuration of a variable degeneration impedance supply circuit according to another exemplary embodiment of the present invention. In this exemplary embodiment, in addition to a capacitor circuit 210_1 and a sub switch SW1 connecting source terminals of alternately connected first and second MOS transistors T1, T2, a plurality of sub capacitor circuits 210_2 to 210_n are additionally provided. Similar to the capacitor circuit 210_1, the sub capacitor circuits 210_2 to 201_n may be embodied in a plurality of serially connected capacitors, each being connected to sub switches SW2, . . . , SWn. Therefore, it becomes possible to vary the magnitude of a degeneration impedance to diverse levels by controlling the switch and the sub switches SW1 to SWn through a predetermined input control signal, respectively.

Moreover, a separate transistor switch T3 is connected between source terminals of the first and second MOS transistors T1, T2. Even though FIG. 2 shows a case where a MOS transistor is employed as the transistor switch T3, a bipolar transistor may be used as well. As shown in FIG. 2, a control signal Mod is input to a gate terminal of the transistor switch T3.

Among the control signals input to the switch T3 and the sub switches SW1 to SWn, a control signal which is input to at least one switch is an inverted signal of a signal Mod. For example, when the signal Mod is 1 (i.e., a high level signal), the inverted signal becomes 0 (i.e., a low level signal), whereas when the signal Mod is 0, the inverted signal becomes 1. In this manner, the connection between the source terminals of the transistors T1 and T2 is maintained in on state.

Figure 3A:
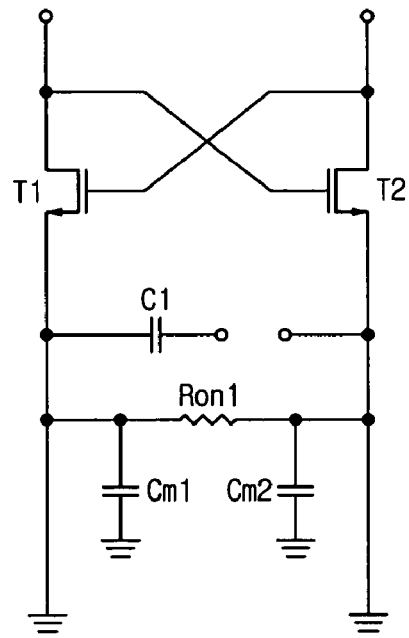
FIGS. 3A and 3B are circuit diagrams of a variable degeneration impedance supply circuit of FIG. 2, each illustrating a state where a circuit configuration changes according to a control signal.
Figure 3B:
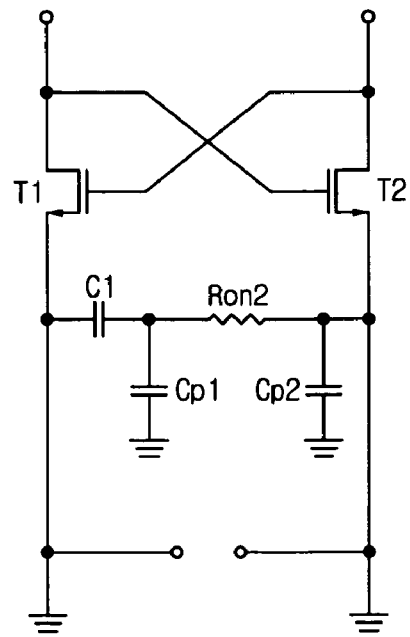

FIG. 3A and FIG. 3B are circuit diagrams explaining how the circuit configuration changes in accordance with the signal Mod. FIG. 3A shows the circuit configuration when Mod=1. When Mod=1, the transistor switch T3 is turned on, and the magnitude of a degeneration impedance is fixed. In this case, the internal resistor Ron1 of the transistor switch T3, the capacitances Cm1 and Cm2 can be included in the component of a degeneration impedance. The capacitance Cm1 indicates the capacitance between the drain terminal and the gate terminal of the transistor switch T3, and the capacitance Cm2 indicates the capacitance between the source terminal and the gate terminal of the transistor switch T3.

FIG. 3B illustrates the circuit configuration when Mod=0. When Mod=0, the transistor switch T3 is off. Therefore, a degeneration impedance can be controlled according to the switching operation of each switch SW1 to SWn. That is, among the switches SW1 to SWn, a switch to which an inverted signal of the signal Mod is input is turned on. Accordingly, capacitance C1 of each capacitor circuit 210_1 to 210_n connected to the switch being turned on, self capacitances Cp1, Cp2 of the switch being turned on, and an internal resistance Ron2 are included in the degeneration impedance components. In short, various degeneration impedances can be supplied by adjusting an input control signal to each switch SW1 to SWn.

Figure 4:
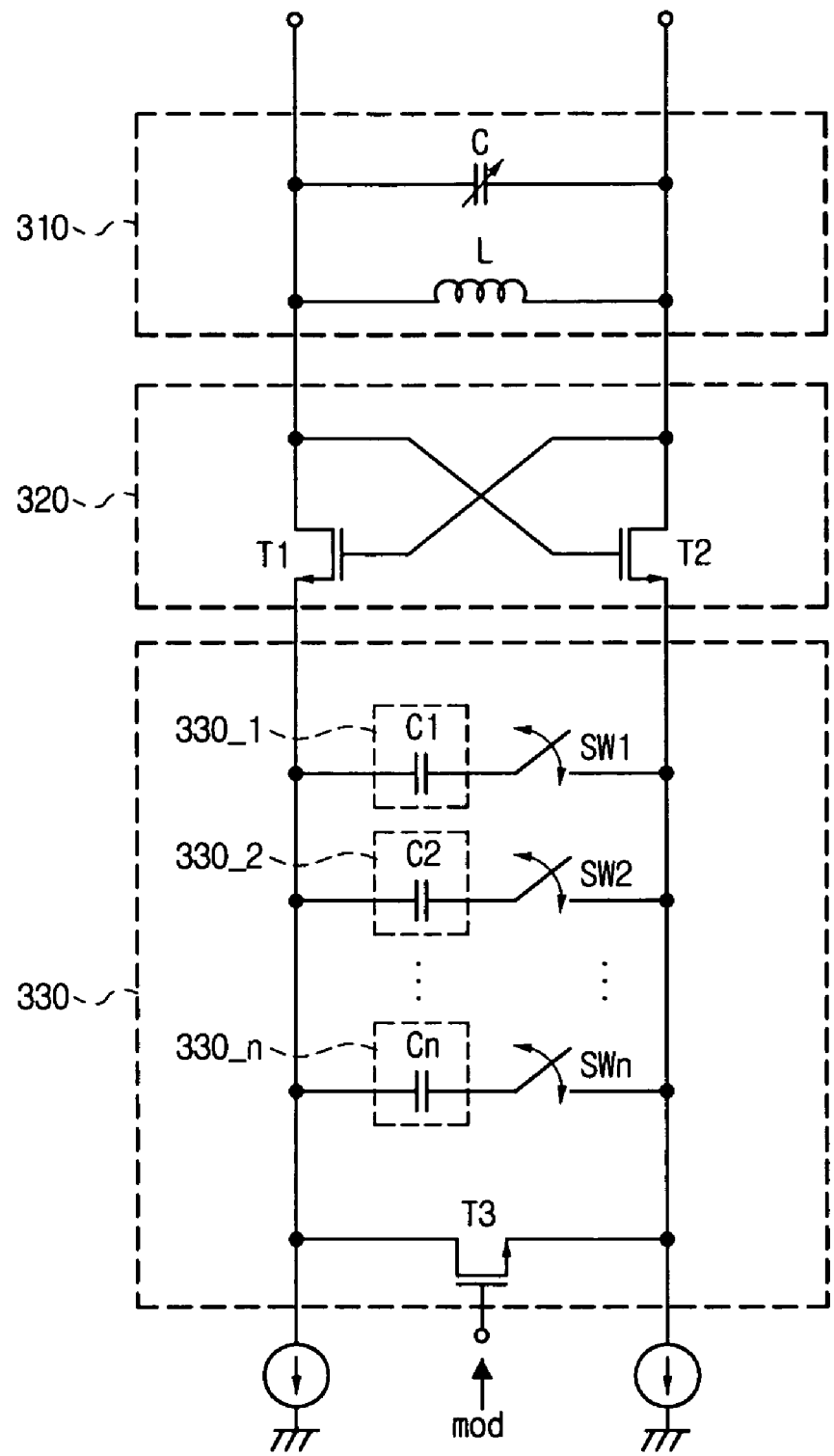
FIG. 4 is a circuit diagram illustrating the configuration of a voltage controlled oscillation circuit, in accordance with an exemplary embodiment of the present invention.

FIG. 4 is a circuit diagram illustrating the configuration of a voltage controlled oscillation circuit, in accordance with an exemplary embodiment of the present invention. As depicted in FIG. 4, the voltage controlled oscillation circuit includes an inductor-capacitor LC tank circuit 310, a transistor circuit 320, and a degeneration impedance control circuit 330.

The LC tank circuit 310 includes a combination of an inductor L and a varactor C. As such, it creates a resonance phenomenon and generates an oscillation signal with a predetermined frequency. In this case, the varactor controls a resonance frequency, so that the voltage controlled oscillation circuit can be operated in a multi-band coverage.

The transistor circuit 320 includes alternately connected first and second transistors T1 and T2. Even though the first and second transistors T1 and T2 are shown as MOS transistors in FIG. 4, bipolar transistors may be used as well. The degeneration impedance can be formed by alternately connecting the first and second transistors T1 and T2. Here, the degeneration impedance is used to remove impedance components generated in the LC tank circuit 310.

Lastly, the degeneration impedance control circuit 330 controls the magnitude of a degeneration impedance formed in the transistor circuit 320. The degeneration impedance control circuit 330 includes at least one capacitor circuit 330_1 to 330_n, and at least one switch SW1 to SWn connected to the capacitor circuits 330_1 to 330_n, respectively.

As described above, the degeneration impedance control circuit 330 may further include a transistor switch T3 connected between source terminals of the first and second transistors T1 and T2. Therefore, when the transistor switch T3 is on, the magnitude of a degeneration impedance is fixed to a predetermined value, whereas when the transistor switch T3 is off, the magnitude of a degeneration impedance can be adjusted according to an input control signal to each switch SW1 to SWn.

Figure 5:
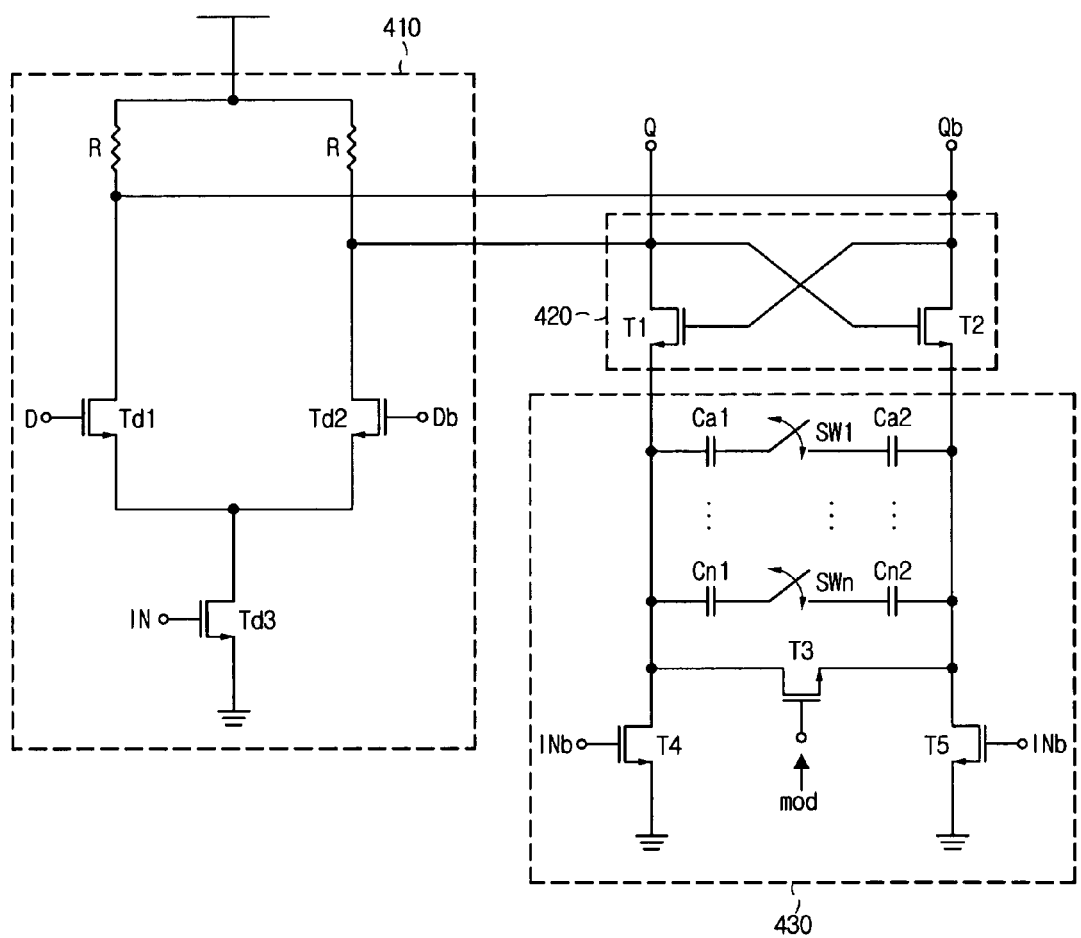
FIG. 5 is a circuit diagram illustrating the configuration of a frequency divider circuit, in accordance with an exemplary embodiment of the present invention.

FIG. 5 is a circuit diagram illustrating the configuration of a frequency divider circuit, in accordance with an exemplary embodiment of the present invention. In detail, the circuit shown in FIG. 5 is an example of D-latch circuit. Referring to FIG. 5, the frequency divider circuit includes a differential input signal detection circuit 410, a transistor circuit 420, and a degeneration impedance control circuit 430.

The differential input signal detection circuit 410 includes a differential amplifier circuit including two transistors $T_{d1}$, $T_{d2}$ connected to face each other. A source terminal of each transistor $T_{d1}$, $T_{d2}$ is connected to the drain terminal of the transistor switch $T_{d3}$. An external control signal IN is input to the gate terminal of $T_{d3}$. That is to say, when an external control signal is a high level signal, the transistor switch $T_{d3}$ is turned on, and the source terminals of the transistors $T_{d1}$, $T_{d2}$ are grounded. As a result, differential input signals D, Db being applied to the gate terminals of the transistors $T_{d1}$, $T_{d2}$ are amplified to a predetermined magnitude and are output.

The transistor circuit 420 forms a degeneration impedance of a predetermined magnitude, removes noise components among an output signal from the differential input signal detection circuit 410, and then stores the noise free signal. To form a degeneration impedance, the transistor circuit 420 includes two alternately connected transistors T1, T2. Although the transistors T1, T2 are shown as MOS transistors FIG. 5, bipolar transistors can be used as well.

The degeneration impedance control circuit 430 includes a plurality of capacitor circuits and a plurality of switches SW1 to SWn. Therefore, a degeneration impedance formed in the transistor circuit 420 can be adjusted. Referring to FIG. 5, each capacitor circuit in the degeneration impedance control circuit 430 includes two capacitors Ca1 and Ca2 to Cn1 and Cn2, which are connected to the switches SW1 to SWn on both sides, respectively. Meanwhile, the degeneration impedance control circuit 430 further includes a transistor switch T3, thereby enabling to choose the degeneration impedance control mode or the degeneration impedance fixed mode according to an external control signal Mod. As explained before, the signal Mod and a control signal for each switch SW1 to SWn can be used as signals in the inversion relation, that is, one is an inverted signal of the other.

The degeneration impedance control circuit 430 further includes two MOS transistor switches T4, T5 where a signal INb is input into gate terminals thereof. The signal INb is a reverse signal for the control signal supplied to the differential input signal detection circuit 410. Therefore, when the differential input signal detection circuit 410 is driven (i.e., a signal IN is a high level signal), the transistor circuit 420 and the degeneration impedance control circuit 430 stop working. On the other hand, when the signal IN is a low level signal, the signal INb becomes a high level signal. Then, the transistor circuit 420 and the degeneration control circuit 430 are driven. In this manner, the voltage controlled oscillation circuit and the frequency divider circuit are able to create variable degeneration impedances.

As explained so far, according to the present invention, it is now possible to control the magnitude of a degeneration impedance in the voltage controlled oscillation circuit and frequency divider circuit with a high degree of precision. This, in turn, enables the voltage controlled oscillation circuit and the frequency divider circuit to work in a multi-band coverage. Moreover, by designing the circuits in such a manner that switches and capacitors are also able to adjust the magnitude of a degeneration impedance, it become easier to reduce the overall size of the circuits.

The foregoing embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A variable degeneration impedance supply circuit comprising:
   first and second transistors, wherein the first transistor and the second transistor are cross-coupled with each other;
   a capacitor circuit which has a predetermined capacitance and is serially connected to output terminals of the first and second transistors;
   a switch which selectively connects or disconnects the capacitor circuit and one of the output terminals of the first and second transistors, according to a first control signal; and
   a transistor switch which selectively and directly connects source terminals of the first and second transistors, according to a second control signal.

2. The circuit according to claim 1, wherein the first and second transistors are MOS transistors, and each of the output terminals of the first and second transistors is a source terminal.

3. The circuit according to claim 2, wherein a drain terminal of the first transistor is connected to a gate terminal of the second transistor, and a drain terminal of the second transistor is connected to a gate terminal of the first transistor.

4. The circuit according to claim 3, wherein the capacitor circuit comprises at least one capacitor.

5. The circuit according to claim 4, further comprising:
   at least one sub capacitor circuit which is connected in parallel to the capacitor circuit and is serially connected between the source terminals of the first and second transistors; and
   at least one sub switch which selectively connects the at least one sub capacitor circuit and one of the source terminals of the first and second transistors, according to a third control signal.

6. The circuit according to claim 1, wherein the second control signal applied to the switch is an inverted signal for the third control signal.

7. The circuit according to claim 5, wherein the switch and the sub switch are metal oxide semiconductor transistors or bipolar transistors.

8. A voltage controlled oscillation circuit comprising:
   an inductance-capacitance (LC) tank circuit which outputs a predetermined frequency signal;
   a transistor circuit which comprises first and second transistors which supply a degeneration impedance to remove a parasitic impedance in the LC tank circuit, wherein the first transistor and the second transistor are cross-coupled with each other; and
   a degeneration impedance control circuit which controls a magnitude of a degeneration impedance of the first and second transistors, according to a first control signal, and selectively and directly connects source terminals of the first and second transistors, according to a second control signal.

9. The circuit according to claim 8, wherein a drain terminal of each of the first and second transistors receives a differential input signal.

10. The circuit according to claim 9, wherein the drain terminal of the first transistor is connected to a gate terminal of the second transistor, and the drain terminal of the second transistor is connected to a gate terminal of the first transistor.

11. The circuit according to claim 10, wherein the degeneration impedance control circuit comprises:
    a capacitor circuit which has a predetermined capacitance value, and is connected in series between source terminals of the first and second transistors; and
    a switch which selectively connects the capacitor circuit and one of the source terminals of the first and second transistors, according to a third control signal.

12. The circuit according to claim 11, wherein the capacitor circuit comprises at least one capacitor.

13. The circuit according to claim 11, wherein the degeneration impedance control circuit further comprises:
    at least one sub capacitor circuit which is connected in parallel to the capacitor circuit and is serially connected between the source terminals of the first and second transistors; and at least one sub switch which selectively connects the sub capacitor circuit and one of the source terminals of the first and second transistors, according to a fourth control signal.

14. The circuit according to claim 13, wherein the degeneration impedance control circuit further comprises a transistor switch which selectively connects the source terminals of the first and second transistors, according to a fifth control signal.

15. The circuit according to claim 14, wherein the fifth control signal applied to the switch is an inverted signal for the fourth control signal.

16. The circuit according to claim 13, wherein the switch and the sub switch are metal oxide semiconductor transistors or bipolar transistors.

17. A frequency divider circuit comprising:
a differential input signal detection circuit which detects a differential input signal, according to an external control signal;
a transistor circuit which comprises first and second transistors which generate a degeneration impedance to remove noise included in the input signal, and stores the input signal having the noise removed, wherein the first transistor and the second transistor are cross-coupled with each other; and
a degeneration impedance control circuit which controls a magnitude of a degeneration impedance generated in the transistor circuit, and selectively and directly connects source terminals of the first and second transistors, according to a first control signal.

18. The circuit according to claim 17, wherein a drain terminal of each of the first and second transistors in the transistor circuit receives a differential input signal.

19. The circuit according to claim 18, wherein the drain terminal of the first transistor is connected to a gate terminal of the second transistor, and the drain terminal of the second transistor is connected to a gate terminal of the first transistor.

20. The circuit according to claim 19, wherein the degeneration impedance control circuit comprises:
a capacitor circuit which is serially connected between source terminals of the first and second transistors; and
a switch which selectively connects the capacitor circuit and one of the source terminals of the first and second transistors, according to a second control signal.

21. The circuit according to claim 20, wherein the capacitor circuit comprises at least one capacitor.

22. The circuit according to claim 20, wherein the degeneration impedance control circuit further comprises:
at least one sub capacitor circuit which is connected in parallel to the capacitor circuit and is serially connected between the source terminals of the first and second transistors; and
a sub switch which selectively connects the sub capacitor circuit and one of the source terminals of the first and second transistors, according to a third control signal.

23. The circuit according to claim 22, wherein the degeneration impedance control circuit further comprises a transistor switch which selectively connects the source terminals of the first and second transistors, according to a fourth control signal.

24. The circuit according to claim 23, wherein the fourth control signal applied to the switch is an inverted signal for the third control signal.

25. The circuit according to claim 22, wherein the switch and the sub switch are metal oxide semiconductor transistors or bipolar transistors.

* * * * *